(12) United States Patent
D'Souza et al.

(10) Patent No.: US 9,078,215 B2
(45) Date of Patent: *Jul. 7, 2015

(54) PROGRAMMABLE TRANSMIT CONTINUOUS-TIME FILTER

(71) Applicant: Skyworks Solutions, Inc., Woburn, MA (US)

(72) Inventors: Sandeep Louis D'Souza, Redondo Beach, CA (US); Bipul Agarwal, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/183,805

(22) Filed: Feb. 19, 2014

(65) Prior Publication Data

US 2014/0235300 A1 Aug. 21, 2014

Related U.S. Application Data

(63) Continuation of application No. 13/185,391, filed on Jul. 18, 2011, now Pat. No. 8,682,263, which is a continuation of application No. PCT/US2009/054417, filed on Aug. 20, 2009.

(60) Provisional application No. 61/145,638, filed on Jan. 19, 2009.

(51) Int. Cl.
*H04B 1/02* (2006.01)
*H04W 52/02* (2009.01)
(Continued)

(52) U.S. Cl.
CPC ...... *H04W 52/0261* (2013.01); *H03H 11/1291* (2013.01); *H03H 2011/0494* (2013.01); *H04B 1/0475* (2013.01); *H04B 1/3833* (2013.01)

(58) Field of Classification Search
CPC ................. H03H 11/1291; H03H 2011/0494; H04B 1/04
USPC ............. 455/91, 101, 114.2, 114.3, 118, 126, 455/127.1, 127.3, 127.4, 306, 307; 327/552
See application file for complete search history.

(56) References Cited

U.S. PATENT DOCUMENTS 5,410,747 A 4/1995 Ohmagari et al.
8,682,263 B2 * 3/2014 D'Souza et al. ................. 455/91
(Continued)

FOREIGN PATENT DOCUMENTS

CN 101366192 2/2009
JP 2008-28509 A 2/2008
(Continued)

OTHER PUBLICATIONS

English Translation of Office Action issued in Japanese Patent Application No. 2011-546240, dated May 21, 2013.
(Continued)

*Primary Examiner* — Tuan Pham
(74) *Attorney, Agent, or Firm* — Knobbe Martens Olson & Bear LLP

(57) ABSTRACT

A programmable-current transmit continuous-time filter (TX-CTF) system can be included in a radio frequency (RF) transmitter. The input of the TX-CTF can receive a baseband transmission signal, and the output of the TX-CTF can be provided to an upconversion mixer for conversion to RF for transmission. The TX-CTF includes amplifier circuitry and passive circuitry that together define the filter parameters. The TX-CTF further includes programmable current circuitry that provides a programmable bias current to the amplifier circuitry. The TX-CTF system also includes control logic that receives one or more transmitter control signals and, in response, generates signals that control the bias current provided to the TX-CTF.

20 Claims, 12 Drawing Sheets

(51) Int. Cl.
*H03H 11/12* (2006.01)
*H04B 1/04* (2006.01)
*H04B 1/3827* (2015.01)
*H03H 11/04* (2006.01)

(56) References Cited

U.S. PATENT DOCUMENTS

| | | | | |
|---|---|---|---|---|
| 2004/0257153 | A1* | 12/2004 | D'Amico et al. | 327/552 |
| 2007/0111686 | A1 | 5/2007 | Lee | |
| 2008/0051044 | A1 | 2/2008 | Takehara | |
| 2008/0111625 | A1* | 5/2008 | Fukuzawa | 330/254 |
| 2008/0191313 | A1 | 8/2008 | Rofougaran et al. | |
| 2010/0052778 | A1* | 3/2010 | Baranauskas et al. | 330/109 |

FOREIGN PATENT DOCUMENTS

| | | |
|---|---|---|
| JP | 2009-28509 | 2/2009 |
| WO | WO 2007/033264 | 3/2007 |

OTHER PUBLICATIONS

International Preliminary Report on Patentability and Written Opinion, re International Application No. PCT/US2009/054417, dated Jul. 19, 2011.

* cited by examiner

| ISET2 | ISET1 | ISET0 | CURRENT IN EACH OF THE TWO BRANCHES | TOTAL CURRENT IN I AND Q SIDES |
|---|---|---|---|---|
| 0 | 0 | 0 | 400 µA | 1.6 mA |
| 0 | 0 | 1 | 800 µA | 3.2 mA |
| 0 | 1 | 0 | 1.2 mA | 4.8 mA |
| 0 | 1 | 1 | 1.6 mA | 6.4 mA |
| 1 | 0 | 0 | 2 mA | 8 mA |
| 1 | 0 | 1 | 3 mA | 12 mA |
| 1 | 1 | 0 | 4 mA | 16 mA |

FIG. 12

| AB2 | AB1 | CURRENT IN EACH OF THE TWO BRANCHES | TOTAL CURRENT IN I AND Q SIDES |
|---|---|---|---|
| 0 | 0 | 107 µA | 428 µA |
| 0 | 1 | 321 µA | 1.284 mA |
| 1 | 0 | 535 µA | 2.14 mA |
| 1 | 1 | 749 µA | 2.996 mA |

FIG. 13

PROGRAMMABLE TRANSMIT CONTINUOUS-TIME FILTER

CROSS-REFERENCE TO RELATED APPLICATIONS

Any and all priority claims identified in the Application Data Sheet, or any correction thereto, are hereby incorporated by reference under 37 CFR 1.57.

BACKGROUND

A transmit continuous-time filter (TX-CTF) is a frequency-selective circuit that is typically included in the transmitter portion of some types of cellular telephones (also referred to as handsets). A TX-CTF typically receives the output of a digital-to-analog converter (DAC) and attenuates the DAC aliasing and noise. The output of the TX-CTF is typically provided to an active upconversion mixer that upconverts the signal from a baseband frequency to the desired radio frequency (RF) band for transmission.

Some tri-mode cellular handsets support Wideband Code Division Multiple Access (WCDMA) modulation, the Gaussian Minimum Shift Keying (GMSK) modulation used in the Global System for Mobile telecommunication (GSM) standard, and the 8-Phase Shift Keying (8PSK) modulation used in the Enhanced Data Rates for Global Evolution (EDGE) standard (also known as the Enhanced Data Rates for GSM Evolution standard). Enabling all three of the above modes in the same handset imposes stringent performance requirements on the TX-CTF, including high current drive capability, high linearity, low input referred noise, and low bandpass ripple. Designing a TX-CTF that meets all of these requirements can be problematic. Straightforward solutions to these challenges that may be proposed, such as increasing current, can introduce other problems. For example, high TX-CTF current consumption can lead to an undesirably high current drain on the cellular handset battery. Minimizing battery current drain is desirable so that talk time and standby time (i.e., the amount of time the handset can be used before the battery requires recharging) can be maximized and battery size can be minimized.

A typical TX-CTF 10 is shown in FIG. 1. As a typical cellular handset transmitter uses a form of quadrature modulation, TX-CTF 10 includes an in-phase (I) portion 12 and a quadrature (Q) portion 14. As portions 12 and 14 are essentially identical, only portion 12 is described in detail herein. Portion 12 includes two sections 16 and 18. Section 16 can be, for example, a $2^{nd}$-order biquadratic stage, and section 18 can be, for example, a $1^{st}$-order real pole stage. Section 16 includes a first amplifier 20 as well as passive circuitry that can include, for example, capacitors 22, 24 and 26, and resistors 28, 30, 32, 34, 36 and 38. The passive circuitry can be selected and connected to first amplifier 20 in an arrangement that defines the desired filter parameters, such as the filter poles and/or zeroes that characterize a $2^{nd}$-order biquadratic filter. Similarly, section 18 includes a second amplifier 40 as well as passive circuitry that can include, for example, capacitors 42 and 44, and resistors 46, 48, 50 and 52. The passive circuitry of section 18 likewise can be selected and connected to second amplifier 40 in an arrangement that defines the desired filter parameters, such as the filter poles and/or zeroes that characterize a $1^{st}$-order real pole filter.

In operation, a differential input signal VI (the negative side of which is represented in FIG. 1 as "V1_N," and the positive side as "V1_P") is provided to stage 16, which outputs a signal V2 (the negative side of which is represented as "V2_N," and the positive side as "V2_P"). The signal V2 is in turn provided to stage 18, which outputs a signal V3 (the negative side of which is represented as "V3_N" and the positive as "V3_P").

As in a typical cellular handset, the in-phase (I) and quadrature (Q) outputs of TX-CTF 10 are provided to active upconversion mixers 54 and 56, respectively. Each of upconversion mixers 54 and 56 is typically of the Gilbert cell type, which presents a high-impedance load to TX-CTF 10. The TX-CTF 10 is readily capable of driving the high impedance load with low current and maintaining the required linearity.

It would be desirable to provide a TX-CTF for a multi-mode cellular handset that can meet the above-described performance criteria or similar performance criteria without consuming excessive current.

SUMMARY

Embodiments of the invention relate to a programmable-current transmit continuous-time filter (TX-CTF) system in a radio frequency (RF) transmitter, and a method of transmitter operation. The input of the TX-CTF can receive a baseband transmission signal, and the output of the TX-CTF can be provided to an upconversion mixer for conversion to RF for transmission. The TX-CTF includes amplifier circuitry and passive circuitry that together define the filter parameters. The TX-CTF further includes programmable current circuitry that provides a programmable bias current to the amplifier circuitry. The TX-CTF system also includes control logic that receives one or more transmitter control signals and, in response, generates signals that control the bias current provided to the TX-CTF. The transmitter control signals can include, for example, one or more of the following: a transmitter modulation mode signal, a transmitter band signal, and a transmitter power signal.

Other systems, methods, features, and advantages of the invention will be or become apparent to one with skill in the art upon examination of the following figures and detailed description.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

FIG. 12 is a table showing an exemplary relation between a control signal and resulting first stage bias current.

FIG. 13 is a table showing an exemplary relation between another control signal and resulting second stage bias current.

DETAILED DESCRIPTION

Figure 2:
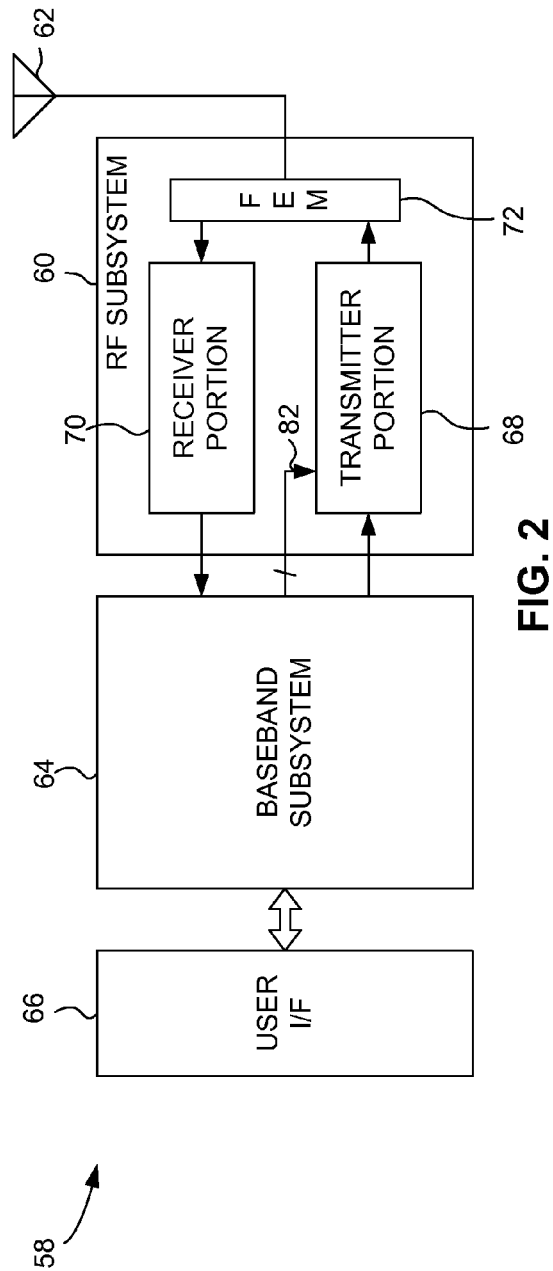
FIG. 2 is a block diagram of an exemplary cellular handset that includes a transmitter portion having a TX-CTF system in accordance an exemplary embodiment of the invention.
Figure 3:
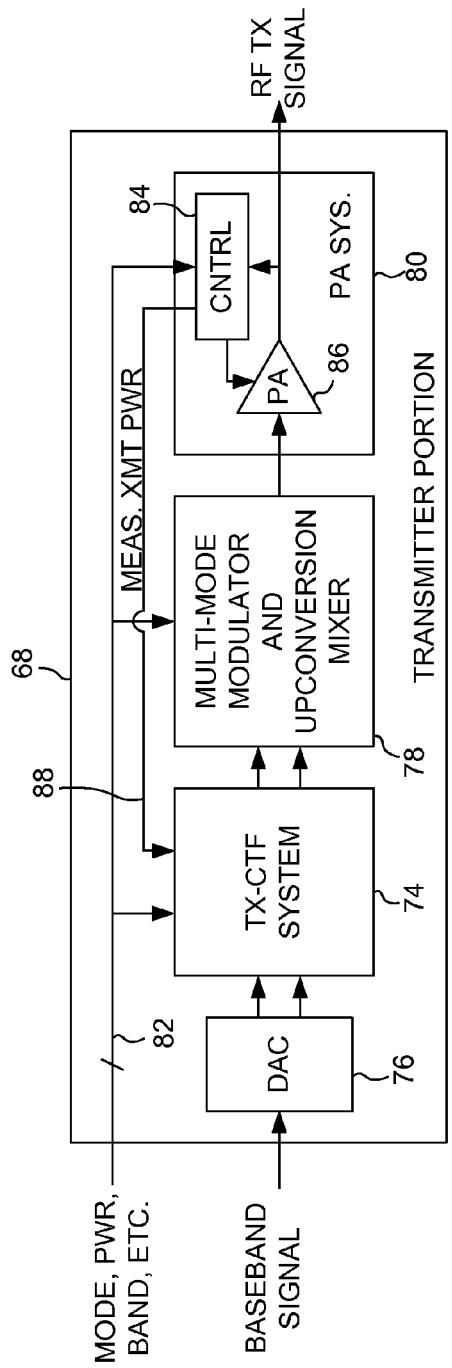
FIG. 3 is a block diagram of the exemplary transmitter portion of FIG. 2.

As illustrated in FIGS. 2-3, in an illustrative or exemplary embodiment of the invention, a mobile wireless telecommunication device 58, such as a cellular telephone handset, includes a radio frequency (RF) subsystem 60, an antenna 62, a baseband subsystem 64, and a user interface section 66. The RF subsystem 60 includes a transmitter portion 68 and a receiver portion 70. The output of transmitter portion 68 and the input of receiver portion 70 are coupled to antenna 62 via a front-end module 72 that allows simultaneous passage of both the transmitted RF signal produced by transmitter portion 68 and the received RF signal that is provided to receiver portion 70. But for certain elements of transmitter portion 68 described below, the above-listed elements can be of the types conventionally included in such mobile wireless telecommunication devices. As conventional elements, they are well understood by persons of ordinary skill in the art to which the present invention relates and, accordingly, not described in further detail herein. However, unlike conventional transmitter portions of such mobile wireless telecommunication devices, transmitter portion 68 includes a transmit continuous-time filter (TX-CTF) system 74 (FIG. 3), having the features described below.

Transmitter portion 68 receives as an input a digital baseband signal from baseband subsystem 64 (FIG. 1) and outputs an RF signal to be transmitted. Transmitter portion 68 further includes a digital-to-analog converter 76, a dual-mode modulator and upconversion mixer 78, and a power amplifier system 80. Digital-to-analog converter 76 converts the digital baseband signal to analog form and provides the resulting analog baseband signal to TX-CTF system 74. The output of TX-CTF system 74 is provided to dual-mode modulator and upconversion mixer 78. The output of dual-mode modulator and upconversion mixer 78 is provided to power amplifier system 80.

Baseband subsystem 64, through an internal microprocessor system or similar logic (not separately shown), can control various operational aspects of mobile wireless telecommunication device 58. For example, baseband subsystem 64 can produce one or more transmitter control signals on one or more connections 82 (e.g., a digital bus) that affect the operation of transmitter portion 68. Transmitter control signals can include, for example, one or more of the following: a transmitter modulation mode signal, a transmitter band signal, and a transmitter power signal.

In the exemplary embodiment, a transmitter modulation mode signal can instruct modulator and upconversion mixer 78 to operate in a selected one of at least two modulation modes. As well understood in the art, multi-mode (e.g., dual-mode or tri-mode) cellular handsets enable roaming between geographic regions in which cellular telecommunication standards differ. Although in other embodiments there can be more than two modes, in this exemplary embodiment the modulation modes can include the WCDMA modulation that is associated with the WCDMA standard and the GMSK modulation that is associated with GSM standard and some aspects of the EDGE standard. As well understood in the art, the EDGE standard uses GMSK modulation for the lower four of its nine modulation and coding schemes but uses higher-order 8PSK modulation for the upper five of those nine modulation and coding schemes.

In a manner well understood in the art, in response to a transmitter modulation mode signal representing a command or instruction issued by baseband subsystem 64 to operate in WCDMA mode, transmitter portion 68 modulates the signal to be transmitted in accordance with the WCDMA standard. In response to a transmitter modulation mode signal representing a command or instruction issued by baseband subsystem 64 to operate in EDGE modulation mode, transmitter portion 68 modulates the signal to be transmitted in accordance with the EDGE standard, i.e., either GMSK or 8PSK modulation. In response to a transmitter modulation mode command issued by baseband subsystem 64 to operate in GSM mode, transmitter portion 68 modulates the signal to be transmitted in accordance with the GSM standard, i.e., GMSK modulation. Although in the exemplary embodiment the modes include any two or more of GSM, EDGE and WCDMA, in other embodiments the modes selected in response to the transmitter modulation mode signal can include these or any other modulation modes known in the art.

The transmitter band signal can instruct modulator and upconversion mixer 78 to operate in a selected one of two or more (frequency) bands. Although in other embodiments there can be more than two bands, in this exemplary embodiment there is a high band and a low band. As well understood in the art, dual-band, tri-band, quad-band, etc., cellular handsets enable operation in geographic regions in which cellular telecommunication standards specify different frequency bands. In response to a transmitter band signal representing a command issued by baseband subsystem 64 to operate in a selected frequency band, transmitter portion 68 upconverts the signal to be transmitted to the selected frequency band.

The transmitter power signal can include one or more signals that indicate the output power at which transmitter portion 68 is operating, indicate the output power at which transmitter portion 68 is instructed to operate, or relate in any other way to the transmitted RF signal power. For example, baseband subsystem 64 can issue a power control command that instructs power amplifier system 80 to set its gain to a selected value and thus amplify its input signal to a corresponding power level. Control circuitry 84 in power amplifier system 80 provides a closed-loop feedback system that maintains the power amplifier 86 at the selected power level or makes other adjustments in response to other conditions, as well understood in the art. There can be any number of selectable power levels, but for illustrative purposes herein there can be two selectable power levels: a low power level and a high power level. As persons of skill in the art understand, the values of the low and high power levels can be in accordance with the applicable standards (e.g., WCDMA, EDGE, GSM, etc.), but for illustrative purposes herein it need only be understood that there are at least two different selectable power levels.

Another transmitter power signal that can be included in addition or alternatively to the transmitter power control signal described above can indicate a measured or detected power level at which transmitter portion 68 is actually operating. Signals 88 indicating such a measured power level at which transmitter portion 68 is operating are produced in control circuitry 84 as part of the closed-loop feedback power control process.

Another transmitter power signal that can be included in addition or alternatively to the transmitter power control signal described above can indicate a "back-off condition in which transmitter operation transitions from a higher transmit power to a lower transmit power. Although not shown for purposes of clarity, transmitter portion 68 can back its transmit power off by, for example, switching an attenuating circuit into the signal path. This type of back-off scheme is contemplated by the WCDMA standard. However, in embodiments of the invention the transmitted power control signal can indicate such a WCDMA back-off condition or any other similar type of back-off condition.

The TX-CTF 74 system receives one or more of the above-described transmitter control signals and, in response, adjusts the bias current provided to its amplifier circuitry, as described in further detail below.

Figure 4:
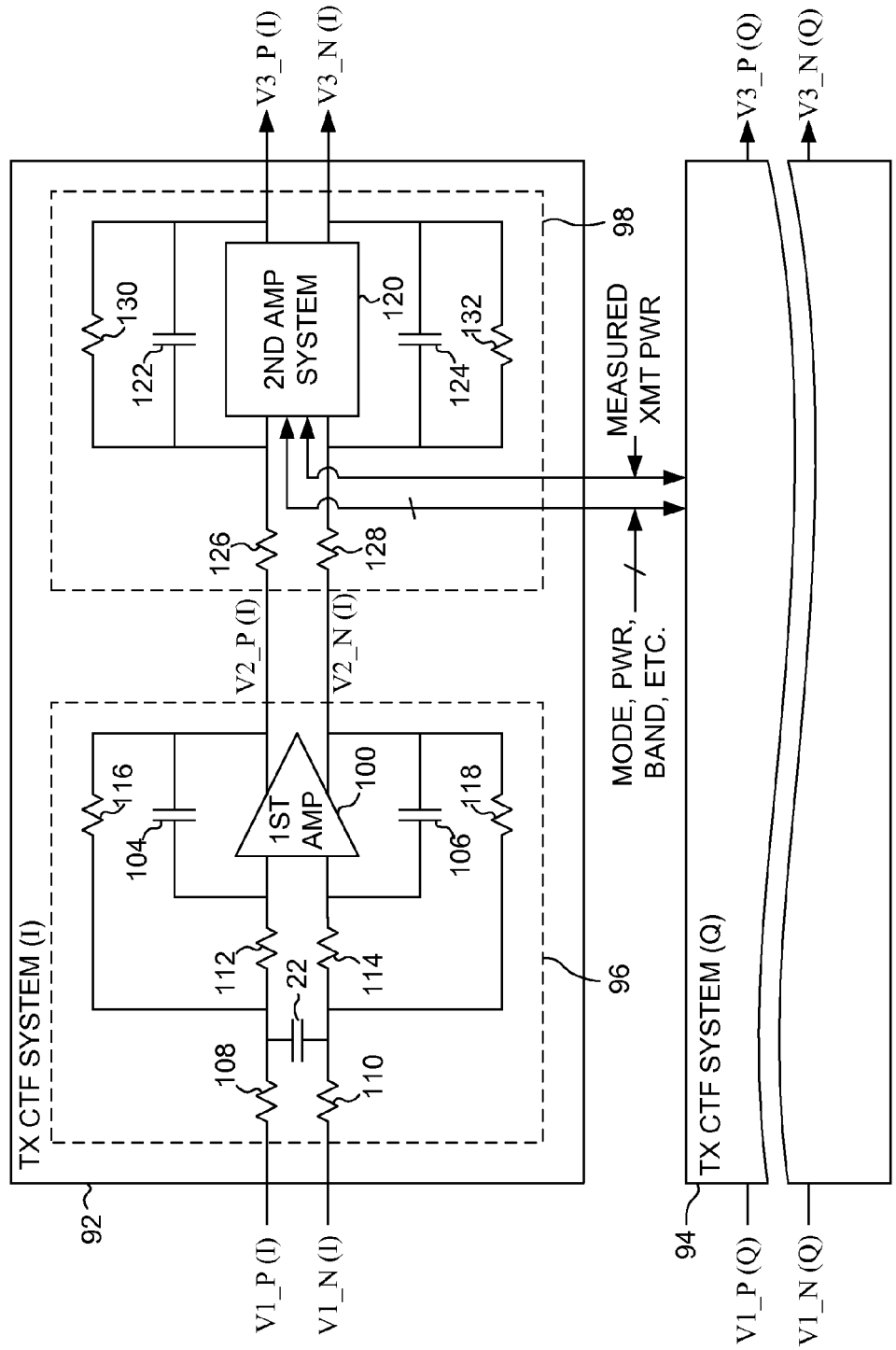
FIG. 4 is a block diagram of the exemplary TX-CTF system of FIG. 3.

As illustrated in FIG. 4, in the exemplary embodiment TX-CTF system 74 includes an in-phase (I) portion 92 and a quadrature (Q) portion 94. As in-phase portion 92 and quadrature 94 are essentially identical, only in-phase portion 92 is described in detail herein. In-phase portion 92 includes first and second sections 96 and 98. Section 96 can define, for example, a $2^{nd}$-order biquadratic filter, and section 98 can define, for example, a $1^{st}$-order real pole filter. Section 96 includes a first amplifier 100 as well as passive circuitry that can include, for example, capacitors 102, 104 and 106, and resistors 108, 110, 112, 114, 116 and 118. The passive circuitry can be selected and connected to first amplifier 100 in an arrangement that defines the desired filter parameters, such as the filter poles and zeroes that characterize a $2^{nd}$-order biquadratic filter. Similarly, section 98 includes a second amplifier system 120 as well as passive circuitry that can include, for example, capacitors 122 and 124, and resistors 126, 128, 130 and 132. The passive circuitry of section 98 can be selected and connected to second amplifier system 120 in an arrangement that defines the desired filter parameters, such as the filter poles and zeroes that characterize a $1^{st}$-order real pole filter. Although in the exemplary embodiment section 96 defines a $2^{nd}$-order biquadratic filter and section 98 defines a $1^{st}$-order real pole filter, in other embodiments either section can comprise any other suitable type of continuous-time filter.

In operation, a differential input signal VI (the negative side of which is represented in FIG. 4 as "V1_N," and the positive polarity as "V1_P") is provided to section 96, which outputs a signal V2 (the negative polarity of which is represented as "V2_N," and the positive polarity as "V2_P"). The signal V2 is in turn provided to section 98, which outputs a signal V3 (the negative polarity of which is represented as "V3_N," and the positive polarity as "V3_P").

Figure 1:
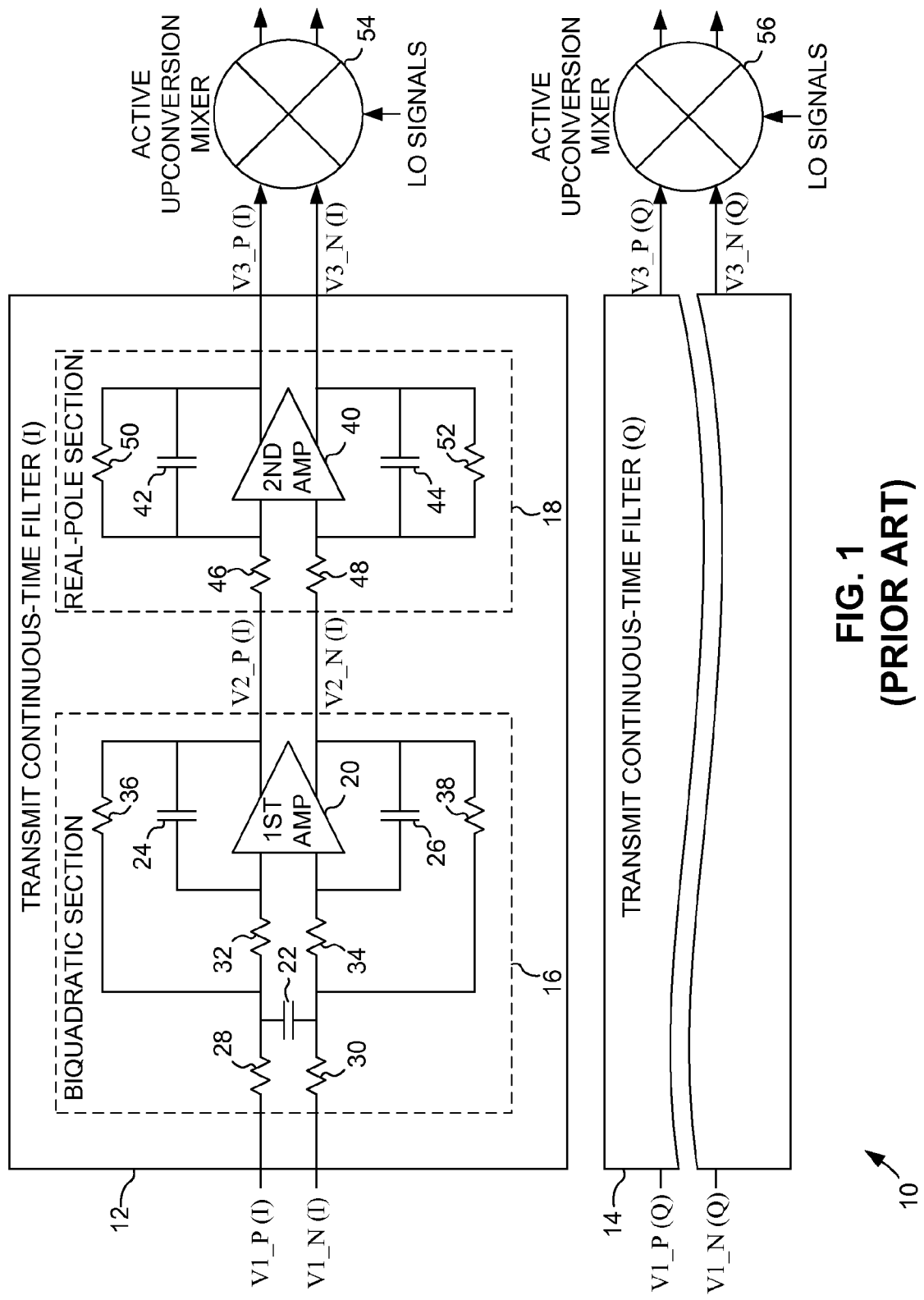
FIG. 1 is a block diagram showing a known or prior transmit continuous-time filter (TX-CTF) connected to an active upconversion mixer.

The in-phase (I) and quadrature (Q) outputs of TX-CTF system 74 are provided to modulator and upconversion mixer 78 (FIG. 3). In the exemplary embodiment, modulator and upconversion mixer 78 includes passive, rather than active, upconversion mixer circuitry. Passive mixers consume less current and can operate at lower supply voltages than active mixers. Using passive mixers is therefore beneficial in reducing power consumption and also in implementing the circuit in lower supply voltages, which permits a smaller handset battery. Like active upconversion mixer circuitry, the passive upconversion mixer circuitry of modulator and upconversion mixer 78 performs frequency translation of the signal, centering the signal at an RF carrier frequency. However, in passive upconversion mixer circuitry, the frequency translation, i.e., upconversion, also leads to a potentially disadvantageous reduction in the input impedance of modulator and upconversion mixer 78. Therefore, for TX-CTF system 74 to drive modulator and upconversion mixer 78 with adequate power levels, TX-CTF system 74 is provided with substantially lower output impedance than the prior TX-CTF 10 (FIG. 1). In the manner described below, TX-CTF system 74 provides such lower output impedance without sacrificing the linearity required by the GMSK modulation and without consuming excessive current.

It can also be noted that use of passive upconversion mixer circuitry leads to substantially more noise being transferred from TX-CTF system 74 to the RF output than would be transferred using active upconversion mixer circuitry. Such noise emanating from transmitter portion 68 (FIG. 2) can undesirably couple into receiver portion 70. A high degree of transmitter noise can impede proper transceiver operation and can exceed permissible thresholds established by the WCDMA, GSM, EDGE or other standards. However, in some instances of handset operation, such as operation in WCDMA mode, the permissible threshold of noise established by the WCDMA standard depends on the transmit power. For example, when the handset is transmitting at a high power level, a lower threshold of noise is permitted. Conversely, when the handset is transmitting at a low power level, a higher threshold of noise is permitted. In addition, when the transmitter is operating in the above-described WCDMA back-of condition, i.e., the transmitter power is being reduced from a higher level to a lower level, the permitted noise threshold is raised as the power is lowered. One example of such a rise in permitted noise threshold versus transmitter power is that, for every 1 decibel of power reduction, the permitted noise threshold is raised by one decibel. Low noise in TX-CTF system 74 requires high current. Conversely, high noise in TX-CTF system 74 can be obtained with lower current. In the manner described below, TX-CTF system 74 promotes minimization of current consumption by providing the lower noise thresholds in response to handset operating conditions, such as the low, high, and back-off transmitter power conditions described above.

Figure 5:
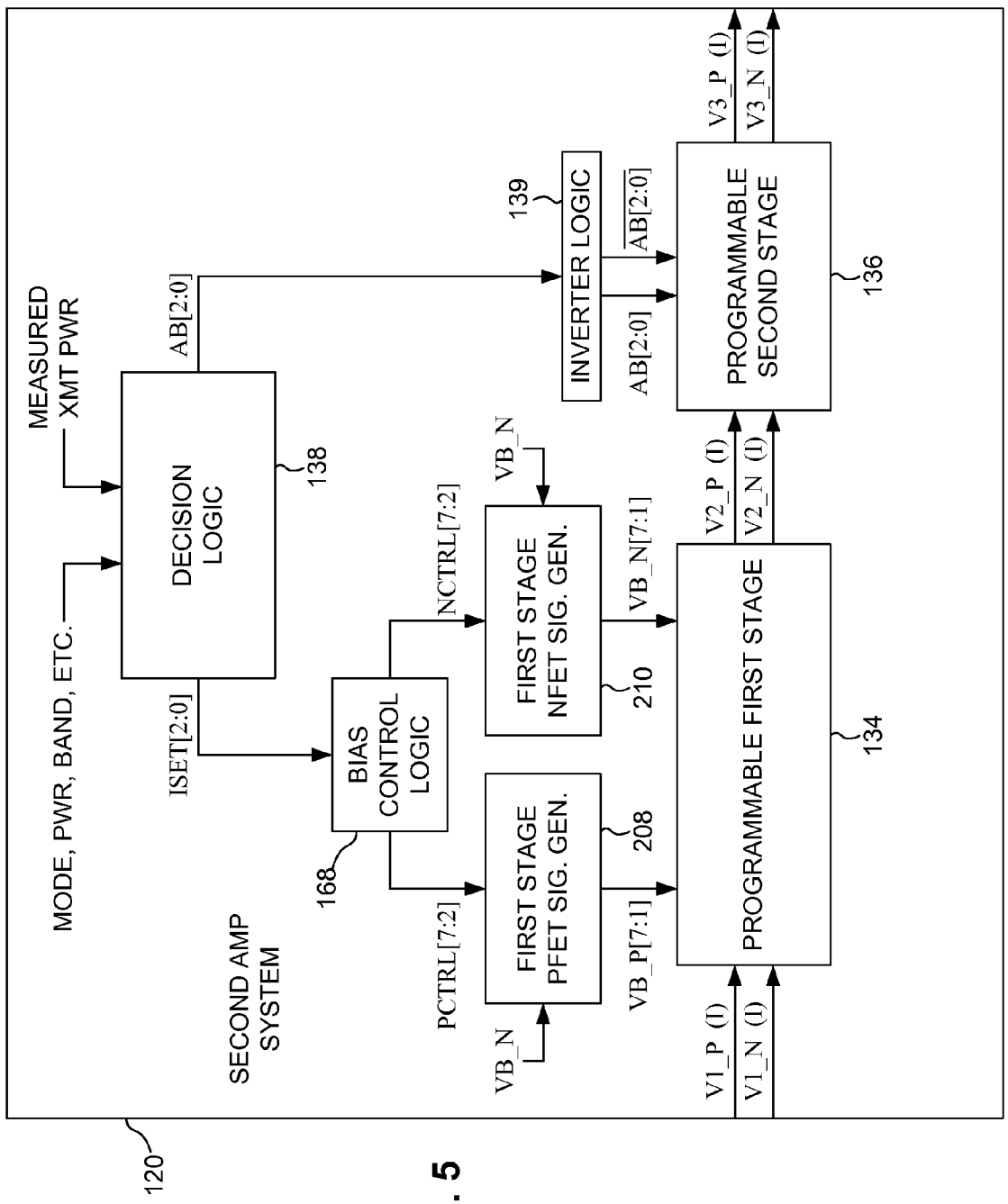
FIG. 5 is a block diagram of the exemplary second amplifier system of the TX-CTF system of FIG. 4.

Second amplifier system 120 (FIG. 4) of in-phase (I) portion 92 is illustrated in further detail in FIG. 5. Although quadrature (Q) portion 94 includes another such second amplifier system, this other second amplifier system is identical to second amplifier system 120 and is therefore not described herein.

As illustrated in FIG. 5, second amplifier system 120 includes a programmable-current first stage 134, a programmable-current second stage 136, and decision logic 138. In the illustrated embodiment, decision logic 138 receives the above-described transmitter control signals and, in response, controls or programs the bias current provided to amplifier circuitry (described below) of programmable-current first stage 134 and programmable-current second stage 136. Decision logic 138 can include any suitable logic that enables a determination of the amount of bias current to provide. For example, decision logic 138 can include a microprocessor or digital signal processor (not shown) programmed in accordance with the logic represented by the flow diagram of FIGS. 6A-B. One output of decision logic 138, representing the amount of bias current to provide to programmable-current first stage 134, is represented in the exemplary embodiment by a 3-bit digital word or signal, ISET, comprising bits ISET0, ISET1 and ISET2. Another output of decision logic 138, representing the amount of bias current to provide to programmable-current second stage 136, is represented in the exemplary embodiment by a 3-bit digital word or signal, AB, comprising bits AB0, AB1 and AB2. (The signal name "AB"

is a reference to the AB class of the amplifier circuitry in programmable second-stage 136 in the exemplary embodiment.) Inverter logic 139 provides the signal AB along with its complement to programmable-current second stage 136.

Figure 6A:
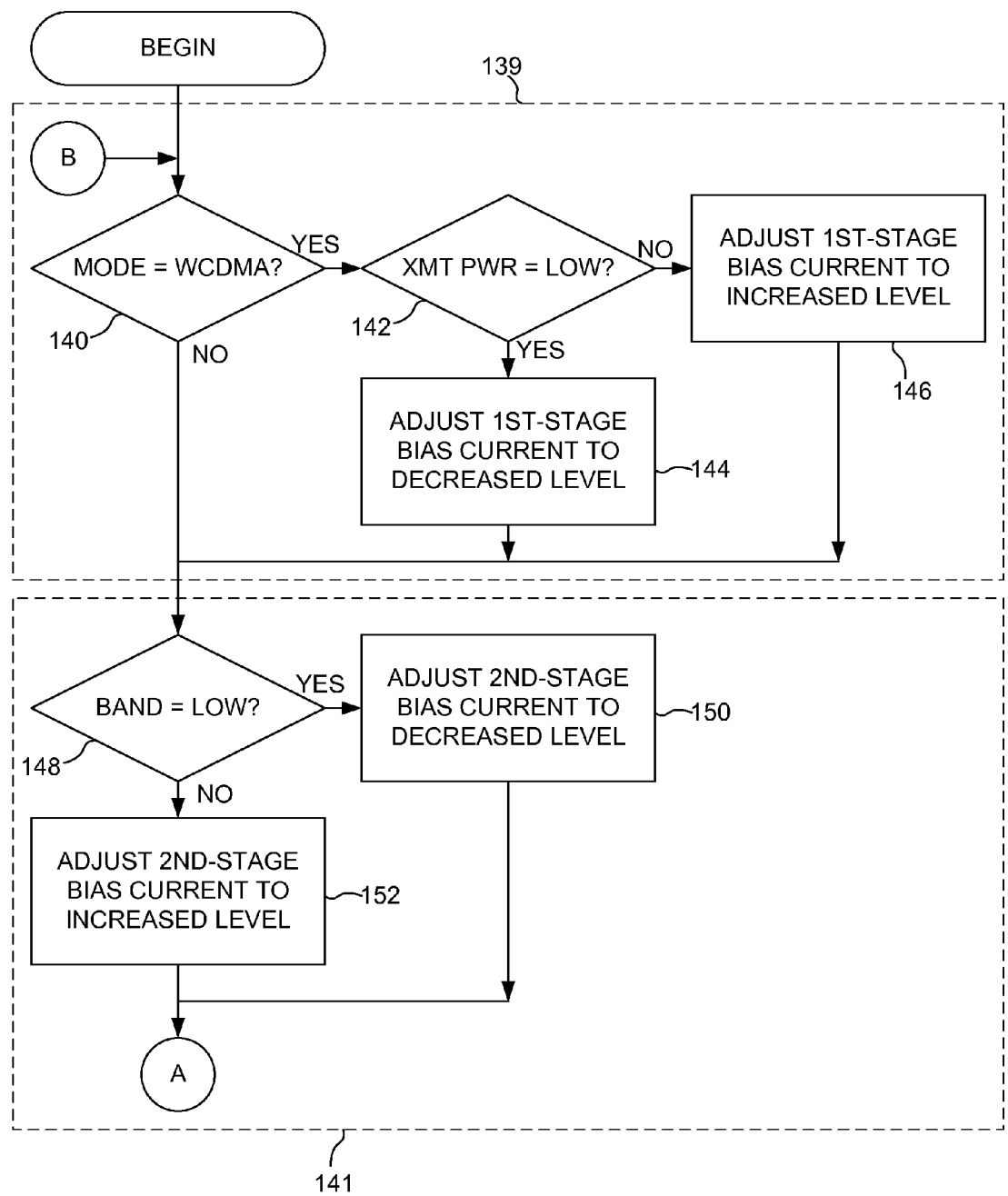
FIG. 6A is a flow diagram illustrating exemplary decision logic of the second amplifier system of FIG. 5.
Figure 6B:
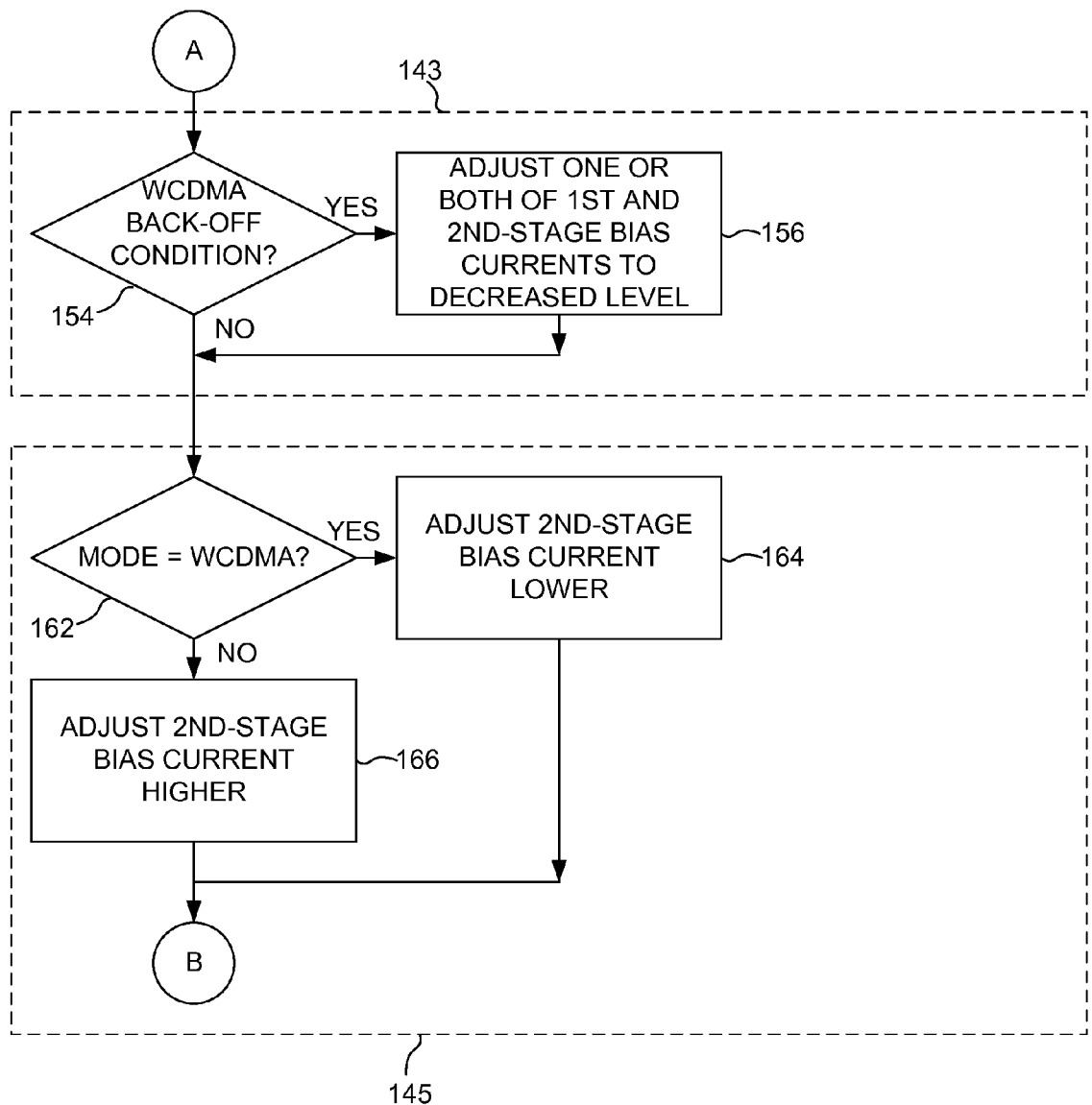
FIG. 6B is a continuation of the flow diagram of FIG. 6A.

As illustrated in FIGS. 6A-B, decision logic 138 can, for example, include several logical sections relating to the operation of programmable-current first stage 134 and programmable-current second stage 136 in response to handset operating conditions. It should be recalled from the description above with regard to FIG. 4 that programmable-current first stage 134 and programmable-current second stage 136 are included in second amplifier system 120 of second section 98. As described in further detail below with regard to FIGS. 6A-B, a first logical section 139 determines the amount of bias current to provide to programmable-current first stage 134 in response to combinations of transmitter modulation mode and transmitter power; a second logical section 141 determines the amount of bias current to provide to programmable-current second stage 136 in response to transmitter band; a third logical section 143 determines the amount of bias current to provide to one or both of programmable-current second stage 134 and programmable-current second stage 136 in response to combinations of transmitter power and whether a transmitter WCDMA power back-off condition exists; and a fourth logical section 145 determines the amount of bias current to provide to programmable-current second stage 136 in response to transmitter modulation mode. Although these logical sections are shown and described for purposes of clarity in the exemplary embodiment as being sequential, they can be integrated with one another in any other suitable manner. For example, in other embodiments such logical sections can operate in parallel or, alternatively, can be combined in the form of a single logical operation, such as evaluation of a formula in software or a network of logic in hardware.

The contributions indicated by logical sections 139, 141, 143 and 145 to the total amount of bias current to be provided to programmable-current first stage 134 and the total amount of bias current to be provided to programmable-current second stage 136 can be added together to determine the totals. The logic represented by the flow diagram of FIGS. 6A-B is intended to be merely exemplary, and other suitable logic will occur readily to persons skilled in the art to which the invention relates in view of the teachings herein. It should also be noted that the logic represented by the flow diagram of FIGS. 6A-B is shown in isolation from other transceiver operations for purposes of clarity. Persons skilled in the art understand that such logic is to be applied at appropriate times, such as upon the occurrence of changes in operating conditions in the transceiver.

With regard to logical section 139, if the transmitter modulation mode is WCDMA, as indicated by block 140, and if a transmitter power signal indicates that the transmitter power is low, as indicated by block 142, then decision logic 138 outputs the ISET signal to adjust the bias current provided to programmable-current first stage 134 to a lower or decreased level (with respect to some predetermined range or scale in which bias current levels can be programmed), as indicated by block 144. For example, as described above, the bias current can be adjusted to a lower or decreased level by contributing a smaller number (selected from a predetermined range or scale of numbers) to the digital sum that the ISET signal indicates. If the transmitter modulation mode is WCDMA, as indicated by block 140, and if a transmitter power signal indicates that the transmitter power is high, as indicated by block 142, then decision logic 138 outputs the ISET signal to adjust the bias current provided to programmable-current first stage 134 to a higher or increased level, as indicated by block 146. For example, as described above, the bias current can be adjusted to a lower level by contributing a larger number to the digital sum that the ISET signal represents.

With regard to logical section 141 section, if the transmitter is operating in the low frequency band, as indicated by block 148, then decision logic 138 outputs the AB signal to adjust the bias current provided to programmable-current second stage 136 to a lower or decreased level, as indicated by block 150. If the transmitter is not operating in the low frequency band (i.e., it is operating in the high frequency band), then decision logic 138 outputs the AB signal to adjust the bias current provided to programmable-current second stage 136 to a higher or increased level, as indicated by block 152.

With regard to logical section 143, if the transmitter is operating in a power back-off condition, as indicated by block 154, then decision logic 138 outputs a combination of one or both of the ISET signal and the AB signal to adjust the bias current provided to one or both of programmable-current first stage 134 and programmable-current second stage 136, respectively, to a lower or decreased level, as indicated by block 156.

Furthermore, in some embodiments, after the bias current has been adjusted in this manner but while the transmitter remains in the power back-off condition, decision logic 138 can further change the ISET signal to adjust the bias current provided to one or both of programmable-current first stage 134 and programmable-current second stage 136 to a different bias current level, i.e., a different combination of bias current levels provided to programmable-current first stage 134 and programmable-current second stage 136. For example, decision logic 138 could initially cause only the bias current provided to programmable-current first stage 134 to be decreased and not cause the bias current provided to programmable-current second stage 136 to be decreased. At some point in time thereafter (e.g., on the order of milliseconds), while the transmitter remains in the power back-off condition, decision logic 138 could then cause both the bias current provided to programmable-current first stage 134 and the bias current provided to programmable-current second stage 136 to be further decreased or otherwise adjusted. Then, at a still later point in time but still while the transmitter remains in the power backoff condition, decision logic 138 could further decrease or otherwise adjust only the bias current provided to programmable-current second stage 136 and not further decrease or otherwise adjust the bias current provided to programmable-current first stage 134. The foregoing adjustment sequence is intended only as an example, and others will occur to persons skilled in the art in view of the teachings herein.

With regard to logical section 145, if the transmitter is operating in the WCDMA modulation mode, as indicated by block 162, then decision logic 138 outputs the AB signal to adjust the bias current provided to programmable-current second stage 136 to a lower or decreased level, as indicated by block 164. If the transmitter is not operating in the WCDMA modulation mode, then decision logic 138 outputs the AB signal to adjust the bias current provided to programmable-current second stage 136 to a higher or increased level, as indicated by block 166.

In response to the ISET signal, bias control logic 168 (FIG. 5) in second amplifier system 120 produces a PFET (p-channel field-effect transistor) digital control word or signal, PCTRL, comprising bits PCTRL2, PCTRL3, PCTRL4, PCTRL5, PCTRL6 and PCTRL7, as well as an NFET (n-channel field-effect transistor) digital control word or signal, NCTRL, comprising bits NCTRL2, NCTRL3, NCTRL4, NCTRL5, NCTRL6 and NCTRL7. As the portion of bias control logic 168 that produces the signal NCTRL is identical to the portion that produces the signal PCTRL, only the portion that produces the signal NCTRL is illustrated and described herein. It should be noted that the number of bits in the various signals described herein are merely exemplary, and that in other embodiments such signals can have any other suitable number of bits.

Figure 7:
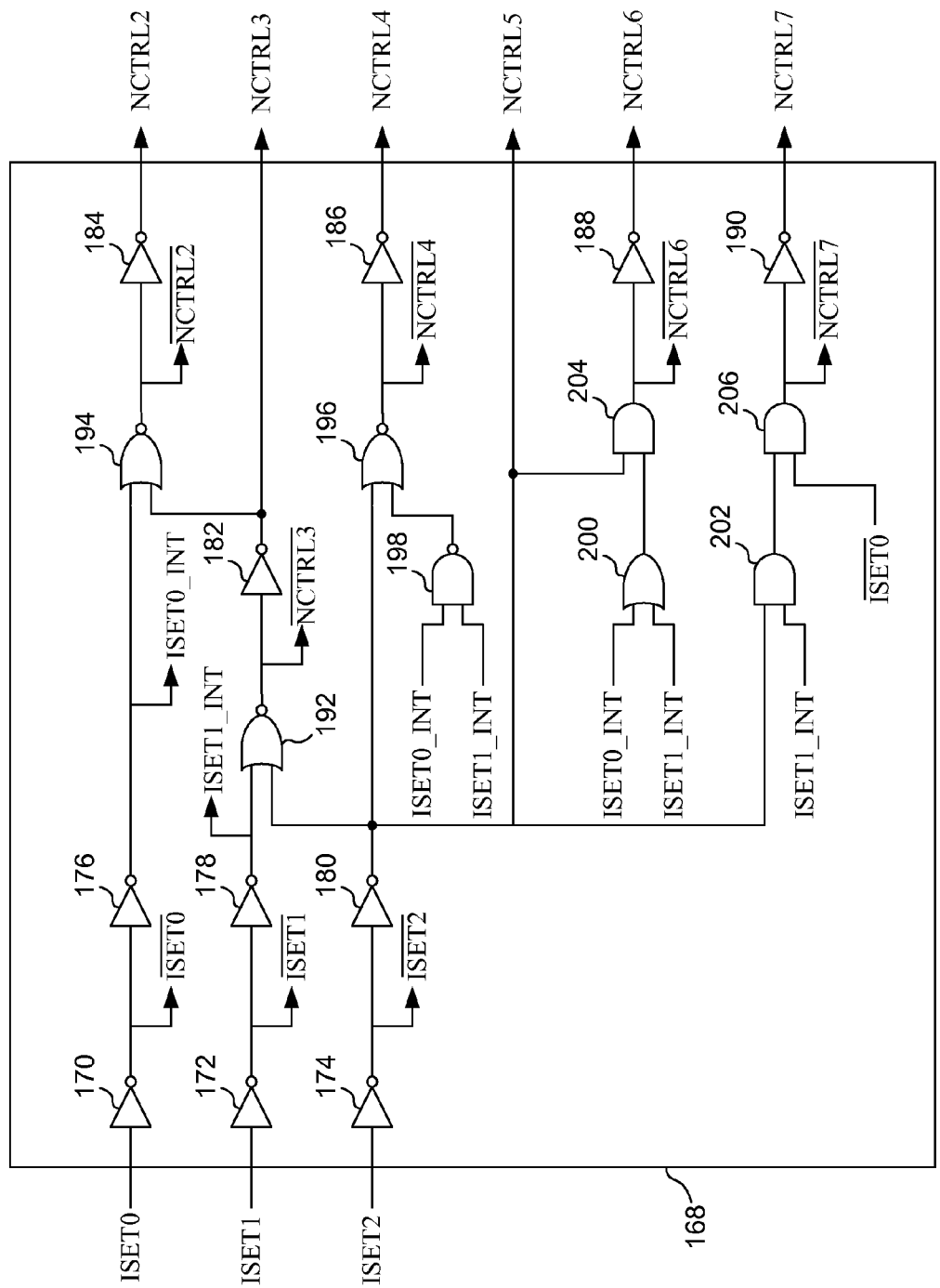
FIG. 7 is a block diagram of a bias control logic portion of the exemplary first stage bias generator circuitry of the second amplifier system of FIG. 5.

As illustrated in FIG. 7, the portion of bias control logic 168 that produces the signal NCTRL can include, for example, a network of combinational logic, such as: inverters 170, 172, 174, 176, 178, 180, 182, 184, 186, 188 and 190; NOR gates 192, 194 and 196; a NAND gate 198; an OR gate 200; and AND gates 202, 204 and 206. The combinational logic shown in FIG. 7 is merely exemplary, and persons skilled in the art understand that the signal NCTRL can be generated in various other ways.

With reference again to FIG. 5, in response to the signal PCTRL and a fixed or constant PFET bias voltage, VB_P, a first stage PFET signal generator 208 produces a set of PFET control voltages, VB_P1, VB_P2, VB_P3, VB_P4, VB_P5, VB_P6 and VB_P7. Similarly, in response to the signal NCTRL and a fixed or constant NFET bias voltage, VB_N, a first stage NFET signal generator 210 produces a set of NFET control voltages, VB_N1, VB_N2, VB_N3, VB_N4, VB_N5, VB_N6 and VB_N7.

Figure 8:
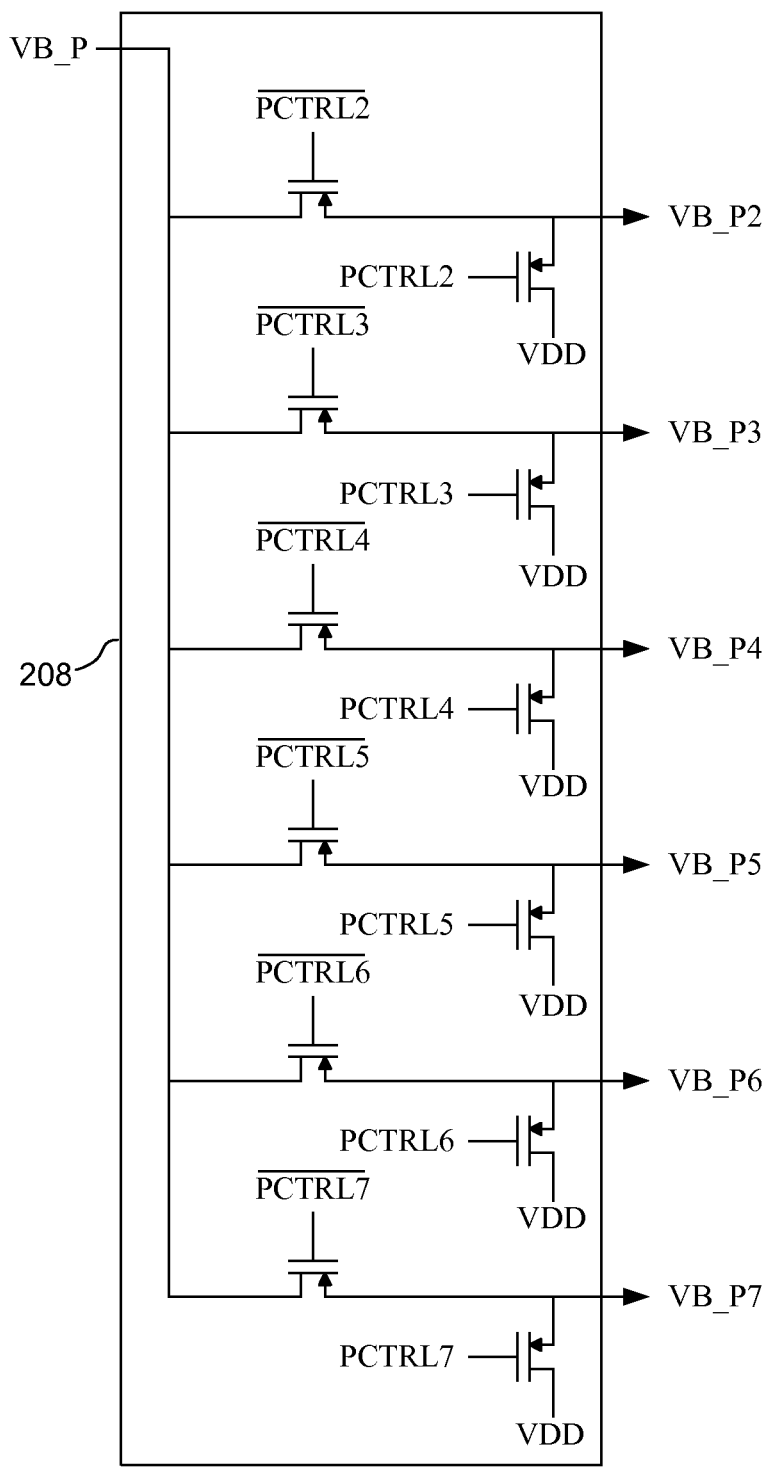
FIG. 8 is a block diagram of an PFET signal generator portion of the exemplary first stage bias generator circuitry of the second amplifier system of FIG. 5.
Figure 9:
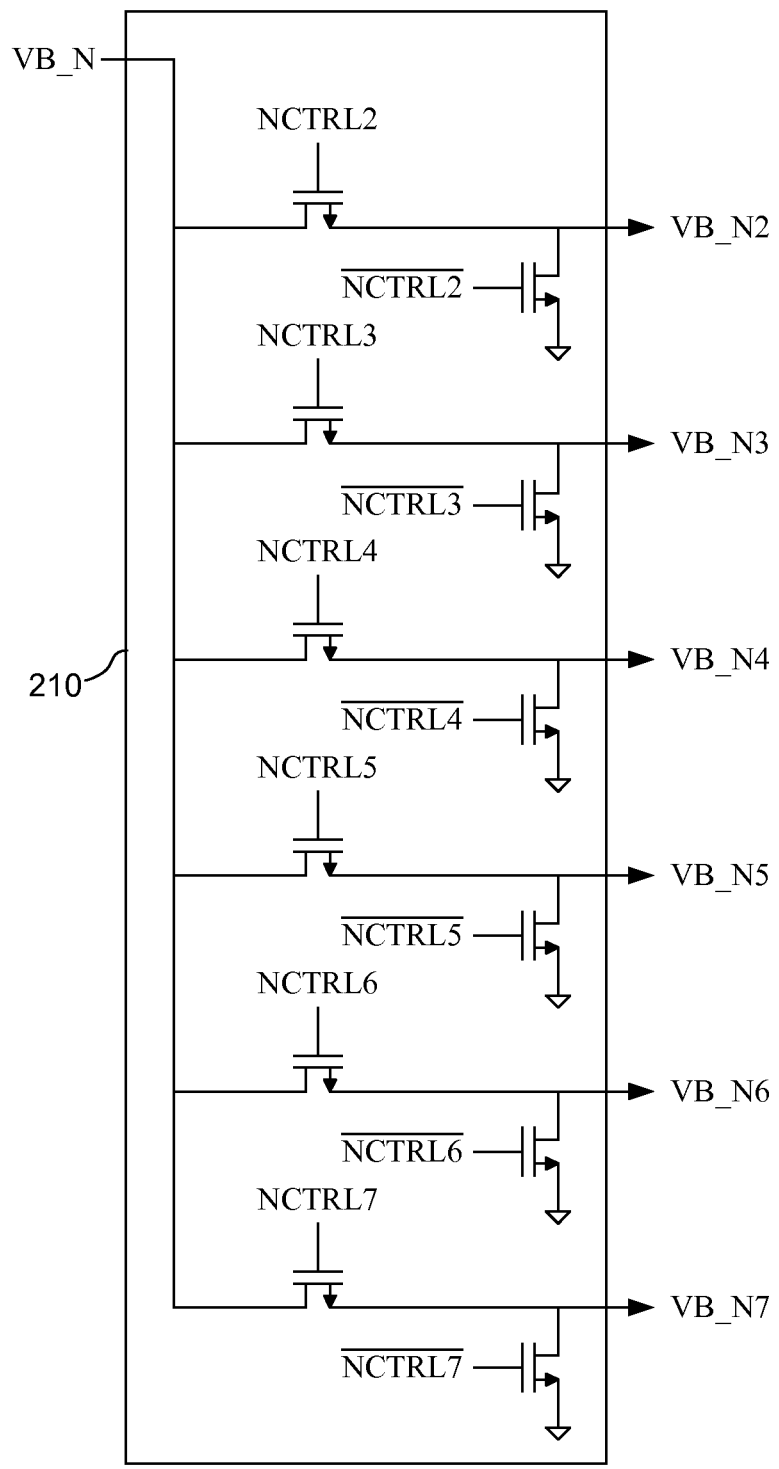
FIG. 9 is a block diagram of a NFET signal generator portion of the exemplary first stage bias generator circuitry of the second amplifier system of FIG. 5.

As further illustrated in FIG. 8, first stage PFET signal generator 208 includes six pairs of PFETs. In each pair, one PFET is controlled by one of bits PCTRL2-PCTRL7 applied to the PFET gate, and the other PFET is controlled by the complement of that bit applied to the PFET gate. Similarly, as further illustrated in FIG. 9, first stage NFET signal generator 210 includes six pairs of NFETs. In each pair, one NFET is controlled by one of bits NCTRL2-NCTRL7 applied to the NFET gate, and the other NFET is controlled by the complement of that bit applied to the NFET gate.

Figure 10:
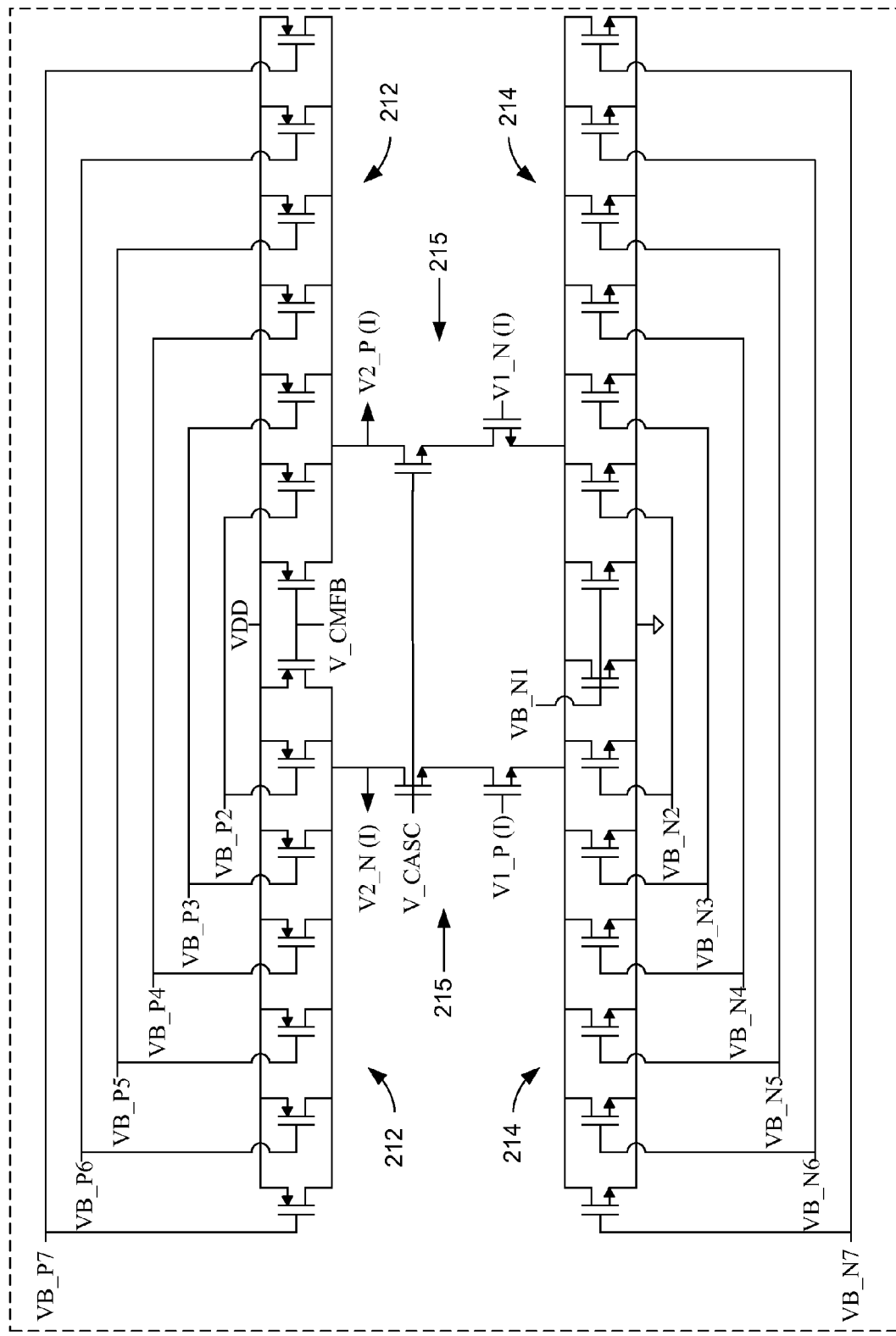
FIG. 10 is a block diagram of a programmable-current first stage of the second amplifier system of FIG. 5.

As illustrated in FIG. 10, programmable-current first stage 134 receives differential input signal VI (i.e., signals V1_N and V1_P), control signals VB_P and VB_N, a fixed or constant supply voltage VDD, a fixed or constant common-mode feedback voltage V_CMFB, and a fixed or constant cascode transistor bias voltage V_CASC and, in response, outputs the signal V2 (i.e., signals V2_N and V2_P). Programmable-current first stage 134 includes a PFET branch 212, comprising 14 PFETs, and an NFET branch 214 comprising 14 NFETs. The PFET branch 212 and NFET branch 214 provide the controllable or programmable bias current to the amplifier transistors 215. As noted above, the programmable-current first stage 134 shown in FIGS. 5 and 10 is included in the in-phase (I) side of the system; an identical programmable-current first stage is included in the quadrature (Q) side of the system but is not shown for purposes of clarity.

Figure 11:
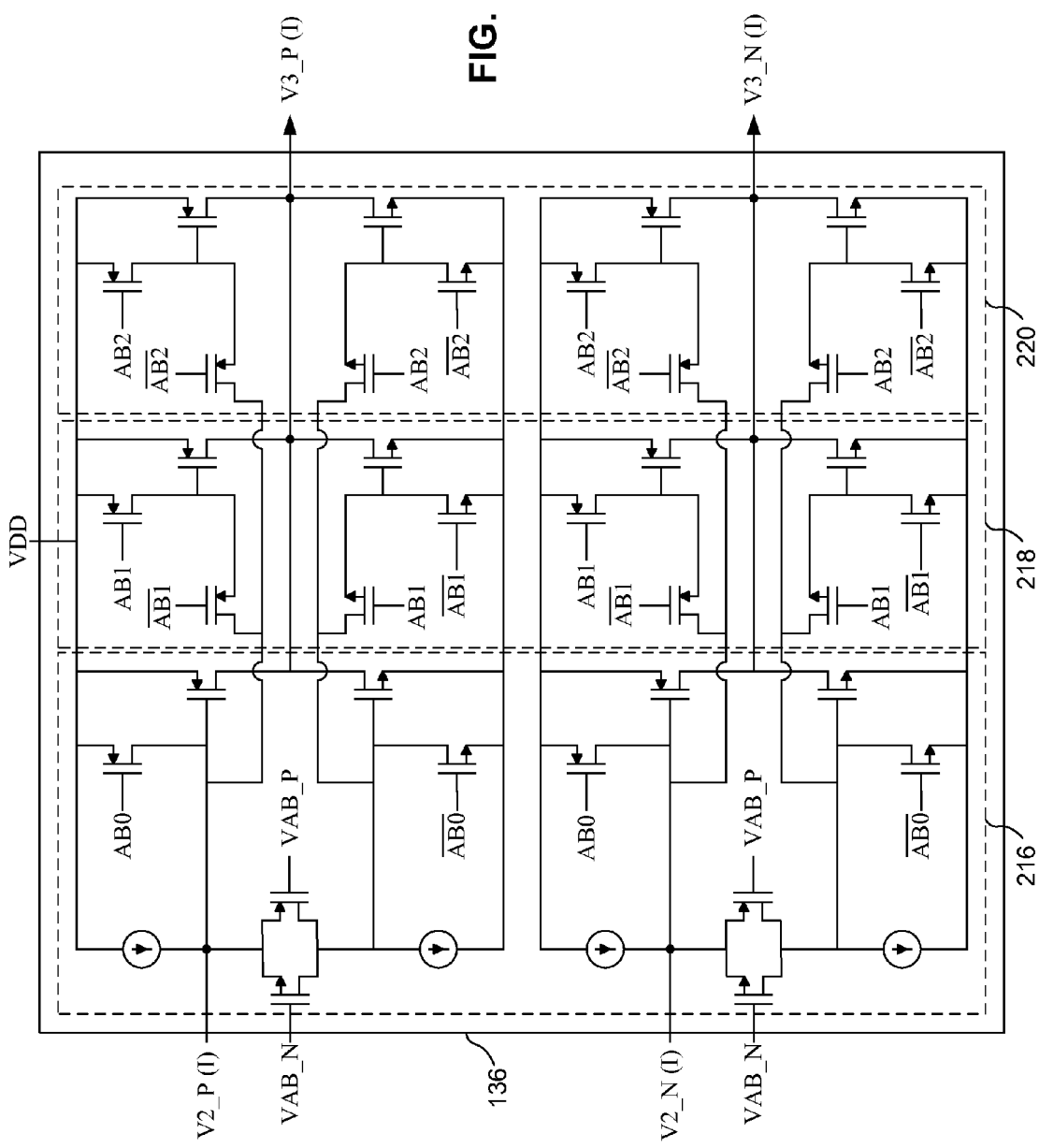
FIG. 11 is a block diagram of a programmable-current second stage of the second amplifier system of FIG. 5.

As illustrated in FIG. 11, programmable-current second stage 136 receives differential input signal V2 (i.e., signals V2_N and V2_P), control signals AB0, AB1 and A2 and their complements, a fixed or constant second-stage PFET bias voltage VAB_P, a fixed or constant second-stage NFET bias voltage VAB_N, and the supply voltage VDD. and, in response, outputs the signal V3 (i.e., signals V3_N and V3_P). Programmable-current second stage 136 includes three branches 216, 218 and 220. Branch 216 remains in an "on" state (i.e., signal AB0 remains high) and contributes the same bias current in all instances of operation of the system, while branches 218 and 220 are used to contribute the controllable or programmable portion of the bias current. Programmable-current second stage 136 shown in FIGS. 5 and 11 is included in the in-phase (I) side of the system; an identical programmable-current second stage is included in the quadrature (Q) side of the system but is not shown for purposes of clarity.

In operation, the output signal V3 represents the result of filtering the input signal VI using TX-CTF system 74 (FIG. 4), where the bias current provided to the amplification circuitry of second amplifier system 120 is controlled or programmed in response to one or more transmitter control signals.

The table in FIG. 12 illustrates an example of a relation between the ISET signal, the resulting bias current provided to each of PFET branch 212 and NFET branch 214 in programmable-current first stage 134 (FIG. 10), and the total of the bias currents provided to these PFET and NFET branches in the combined in-phase and quadrature (Q) sides of the system.

The table in FIG. 13 illustrates an example of a relation between the AB signal, the resulting bias current provided to each of branches 218 and 220 in programmable-current second stage 136 (FIG. 10), and the total of the bias currents provided to these branches in the combined in-phase and quadrature (Q) sides of the system.

In the manner described above with regard to the exemplary embodiment, the present invention adjusts TX-CTF noise performance and linearity in response to transmitter operating conditions. To meet performance requirements specified by the various standards (e.g., GMSK, EDGE, WCDMA, etc.) implicated by a multi-mode transceiver, it is desirable to provide low noise and high linearity, but absent the present invention, simultaneously meeting all of the performance requirements of all of the various standards under all of the various operating conditions could come at the cost of high current consumption. To meet such performance requirements with the lowest average power consumption, the present invention provides low noise and high linearity to no greater an extent than demanded by transmitter operating conditions.

As described above, changing the bias current provided to programmable-current first stage 134 changes the noise in the amplification circuitry of programmable-current first stage 134. Higher bias current provided to programmable-current first stage 134 results in low noise in the amplification circuitry of programmable-current first stage 134. Lower bias current provided to programmable-current first stage 134 results in higher noise in the amplification circuitry of programmable-current first stage 134. The noise performance of the amplification circuitry of programmable-current first stage 134 is a dominant contributor to the noise of TX-CTF system 74 as whole and ultimately the noise of transmitter portion 68 (FIG. 2) as a whole. In, for example, WCDMA mode, the noise requirement is dependent on transmitter output power. At higher transmit powers lower noise is required and vice versa. Also, in a back-off condition the noise requirement is relaxed. By programming the programmable-current first stage 134 in response to one or more of modulation mode, transmit power, and back-off condition, TX-CTF system 74 provides the low noise performance only when required by such operating conditions, thereby minimizing the average power consumption of TX-CTF system 74 as a whole and ultimately transmitter portion 68 as a whole.

Similarly, as described above, changing the bias current provided to programmable-current second stage 136 changes the output current drive and linearity in the amplification circuitry of programmable-current second stage 136. Higher bias current provided to programmable-current second stage 136 results in higher output current drive capability and higher linearity in the amplification circuitry of programmable-current second stage 136. Lower bias current provided to programmable-current second stage 136 results in lower output current drive capability and lower linearity in the amplification circuitry of programmable-current second stage 136. High current drive capability is required when high linearity performance of TX-CTF system 74 is required, such as when transmitter portion 68 is in GMSK mode, or when the input impedance of dual-mode modulator and upconversion mixer 78 is lower, such as when transmitter portion 68 is operating in a high frequency band. Conversely, a lower current drive capability is sufficient when lower linearity performance of TX-CTF system 74 is sufficient, such as when transmitter portion 68 is in WCDMA mode, or when the input impedance of dual-mode modulator and upconversion mixer 78 is higher, such as when transmitter portion 68 is operating in a low frequency band. By programming programmable-current second stage 136 in response to one or both of transmitter mode and frequency band, TX-CTF system 74 provides the high linearity performance only when required by such operating conditions, thereby minimizing the average power consumption of TX-CTF system 74 as a whole and ultimately transmitter portion 68 as a whole.

While various embodiments of the invention have been described, it will be apparent to those of ordinary skill in the art that many more embodiments and implementations are possible that are within the scope of this invention. For example, although examples of suitable transmitter control signals and their use in determining an amount of bias current to provide are described, others will occur readily to persons skilled in the art in view of the teachings herein. Accordingly, the invention is not to be restricted except in light of the following claims.

What is claimed is:

1. A radio frequency (RF) transmitter comprising:
 a programmable-current transmit continuous-time filter (TX-CTF) including a programmable-current first CTF stage having an input configured to receive a baseband transmission signal, first CTF stage amplifier circuitry, and programmable first CTF stage current circuitry configured to provide a first stage bias current generated in response to first digital programming data to the first CTF stage amplifier circuitry, the programmable-current TX-CTF further including a programmable-current second CTF stage having an input configured to receive an output of the programmable-current first CTF stage, second CTF stage amplifier circuitry, and programmable second CTF stage current circuitry configured to provide a second stage bias current generated in response to second digital programming data to the second CTF stage amplifier circuitry; and
 control logic configured, in response to the one or more transmitter control signals, to produce the first and second digital programming data.

2. The RF transmitter of claim 1 wherein the control logic is further configured to control at least one of linearity of the programmable-current TX-CTF and noise performance of the programmable-current TX-CTF with the first and second digital programming data.

3. The RF transmitter of claim 2 wherein the one or more transmitter control signals include a transmitter modulation mode signal indicative of at least a wideband code-division multiple access (WCDMA) mode and another mode, when the transmitter modulation mode signal indicates the WCDMA mode, the control logic is configured to produce the first digital programming data so as to cause the programmable first CTF stage current circuitry to generate a high bias current in response to the transmitter power signal indicating a high transmit power, and to produce the first digital programming data so as to cause the programmable first CTF stage current circuitry to generate a low bias current in response to the transmitter power signal indicating a low transmit power.

4. The RF transmitter of claim 1 wherein the one or more transmitter control signals include a transmitter power signal indicating at least a low transmit power and a high transmit power, the control logic is configured to produce the first digital programming data so as to cause the programmable first CTF stage current circuitry to generate a high bias current in response to the transmitter power signal indicating a high transmit power, and the control logic is configured to produce the first digital programming data so as to cause the programmable first CTF stage current circuitry to generate a low bias current in response to the transmitter power signal indicating a low transmit power.

5. The RF transmitter of claim 1 wherein the one or more transmitter control signals include a transmitter band signal indicative of at least a low transmit frequency and a high transmit frequency, the control logic is configured to produce the second digital programming data so as to cause the programmable second CTF stage current circuitry to generate a low bias current in response to a transmitter band signal indicating a low transmit frequency, and the control logic is configured to produce the second digital programming data so as to cause the programmable second CTF stage current circuitry to generate a high bias current in response to a transmitter band signal indicating a high transmit frequency.

6. The RF transmitter of claim 1 wherein the one or more transmitter control signals include a transmitter modulation mode signal indicative of at least a wideband code-division multiple access (WCDMA) mode and a Gaussian Minimum Shift Keying (GMSK) mode, the control logic is configured to produce the second digital programming data so as to cause the programmable second CTF stage current circuitry to generate a low bias current in response to the transmitter modulation mode signal indicating the WCDMA mode, and the control logic is configured to produce the second digital programming data so as to cause the programmable second CTF stage current circuitry to generate a high bias current in response to the transmitter modulation mode signal indicating the GMSK mode.

7. The RF transmitter of claim 1 wherein the one or more transmitter control signals include one or more transmitter power signals indicative a condition of backing off from a higher transmit power to a lower transmit power by attenuating a transmit signal, and the control logic is configured to produce at least one of the first digital programming data and the second digital programming data so as to cause at least one of the programmable first and second CTF stage current circuitry to generate a low bias current in response to the transmitter power signals indicating the condition of backing off.

8. The RF transmitter of claim 7 wherein the condition of backing off includes a WCDMA back-off condition.

9. The RF transmitter of claim 1 wherein the one or more transmitter control signals include at least one of transmitter a modulation mode signal, a transmitter band signal, and a transmitter power signal.

10. A method of operating a radio frequency (RF) transmitter, comprising:
 providing a baseband transmission signal to an input of a programmable-current transmit continuous-time filter (TX-CTF);

producing first digital programming data and second digital programming data in response to the one or more transmitter control signals;

in response to the first digital programming data, using programmable first CTF stage current circuitry of a programmable-current first CTF stage of the programmable-current TX-CTF to generate a first programmable bias current;

providing the first programmable bias current to first CTF stage amplifier circuitry of the programmable-current first CTF stage;

in response to the second digital programming data, using programmable second CTF stage current circuitry of a programmable-current second CTF stage of the programmable-current TX-CTF to generate a second programmable bias current; and providing the second programmable bias current to second CTF stage amplifier circuitry of the programmable-current second CTF stage.

11. The method of claim 10 further comprising controlling at least one of linearity of the programmable-current TX-CTF and noise performance of the programmable-current TX-CTF by with the first and second digital programming data.

12. A method for operating a radio frequency (RF) transmitter, comprising:

providing a baseband transmission signal to an input of a programmable-current transmit continuous-time filter (TX-CTF), the programmable-current TX-CTF further including a programmable-current first CTF stage having an input receiving the baseband transmission signal and a programmable-current second CTF stage having an input receiving an output of the programmable-current first CTF stage;

providing a high bias current to amplifier circuitry of the programmable-current first CTF stage in response to a transmitter power signal indicating a high transmit power;

providing a low bias current to the amplifier circuitry of the programmable-current first CTF stage in response to the transmitter power signal indicating a low transmit power; and providing an output of the programmable-current TX-CTF to an upconverter in the transmitter.

13. The method of claim 12 wherein providing an output of the programmable-current TX-CTF to an upconverter includes providing the output of the programmable TX-CTF to a passive mixer.

14. The method of claim 12 wherein the one or more transmitter control signals include a transmitter modulation mode signal indicating at least a wideband code-division multiple access (WCDMA) mode and another mode, wherein said providing a high bias current includes providing a high bias current to the amplifier circuitry of the programmable-current first CTF stage in response to the transmitter power signal indicating a high transmit power and a transmitter modulation mode signal indicating the WCDMA mode, and wherein said providing a low bias current includes providing a low bias current to the amplifier circuitry of the programmable-current first CTF stage in response to a transmitter power signal indicating a low transmit power and a transmitter modulation mode signal indicating the WCDMA mode.

15. The method of claim 12 wherein the one or more transmitter control signals include a transmitter band signal indicating at least a low transmit frequency and a high transmit frequency, the method further comprising:

providing a low bias current to the programmable-current second CTF stage in response to a transmitter band signal indicating a low transmit frequency; and providing a high bias current to the programmable-current second CTF stage in response to a transmitter band signal indicating a high transmit frequency.

16. The method of claim 12 wherein the one or more transmitter control signals include one or more transmitter power signals indicating a condition of backing off from a higher transmit power to a lower transmit power by attenuating a transmit signal, the method further comprising, in response to the indication of the condition of backing off, providing a low bias current to at least one of the programmable-current first CTF stage and the programmable-current second CTF stage.

17. The method of claim 16 wherein the condition of backing off includes a WCDMA back-off condition.

18. The method of claim 12 wherein the one or more transmitter control signals include at least one of a transmitter modulation mode signal, a transmitter band signal, and a transmitter power signal.

19. A radio frequency (RF) transmitter, comprising:

a programmable-current transmit continuous-time filter (TX-CTF) including an input configured to receive a baseband transmission signal, a programmable-current first CTF stage having an input configured to receive the baseband transmission signal, and a programmable-current second CTF stage having an input configured to receive an output of the programmable-current first CTF stage;

control logic configured to provide a high bias current to amplifier circuitry of the programmable-current first CTF stage in response to a transmitter power signal indicating a high transmit power and to provide a low bias current to the amplifier circuitry of the programmable-current first CTF stage in response to the transmitter power signal indicating a low transmit power; and an upconverter configured to receive an output of the programmable-current TX-CTF.

20. The RF transmitter of claim 19 wherein upconverter includes a passive mixer.

* * * * *